United States Patent [19]

Iesaka et al.

[11] Patent Number: 4,807,037
[45] Date of Patent: Feb. 21, 1989

[54] LOW NOISE CCD IMAGE SENSOR HAVING A PLURALITY OF HORIZONTAL CCD REGISTERS

[75] Inventors: Mamoru Iesaka, Kawasaki; Yoshiyuki Matsunaga, Kamakura; Sohei Manabe; Nozomu Harada, both of Yokohama, all of Japan

[73] Assignee: Kabushiki Kaisha Toshiba, Kawasaki, Japan

[21] Appl. No.: 117,614

[22] Filed: Nov. 6, 1987

[30] Foreign Application Priority Data

Mar. 6, 1987 [JP] Japan ................................. 62-50260
Mar. 6, 1987 [JP] Japan ................................. 62-50261

[51] Int. Cl.$^4$ ............................................. H04N 3/14
[52] U.S. Cl. ........................... 358/213.31; 358/213.23; 358/213.26; 357/30; 357/24
[58] Field of Search ...................... 358/213.11, 213.31, 358/213.23, 213.26; 357/30 D, 30 F, 24 LR

[56] References Cited

U.S. PATENT DOCUMENTS 4,206,371  6/1980  Weimer ............................ 357/30 D

OTHER PUBLICATIONS

K. Orihara et al., "New Tecnologies in Dual Channel Read-Out Registers for High Density CCD Image Sensor", IEDM Tech. Dig., pp. 365–368, 1986.
T. H. Lee et al., "A Color CCD Image Sensor for Imaging Photographic Negatives", Proc. 16th Conf. Solid State Devices and Materials, pp. 329–332, 1984.
G. A. Beck et al., "High Density Frame Transfer Image Sensor", Proc. 14th Conf. Solid State Devices, pp. 109–112, 1982.

Primary Examiner—Jin F. Ng
Assistant Examiner—Stephen Brinich
Attorney, Agent, or Firm—Oblon, Fisher, Spivak, McClelland & Maier

[57] ABSTRACT

In a CCD image sensor, a plurality of horizontal CCD registers are disposed adjacent to an image sensing area having matrix-arrayed image sensing cells and a plurality of vertical CCD registers. In the CCD image sensor, the channel impurity concentration of second horizontal CCD register, located away from the image sensing area, is more higher than that of first horizontal CCD register. With this feature, when the charges are transferred to the second horizontal CCD register across the first horizontal register, the residual charges in the first horiozntal CCD register are remarkably reduced.

16 Claims, 10 Drawing Sheets

LOW NOISE CCD IMAGE SENSOR HAVING A PLURALITY OF HORIZONTAL CCD REGISTERS

BACKGROUND OF THE INVENTION

This invention relates to a CCD image sensor having a plurality of horizontal CCD registers.

The interline transfer CCD (IT-CCD) image sensor is known as a typical example of a CCD image sensor, and is formed by integrating, onto a semiconductor substrate, a plurality of matrix arrayed photo diodes, which serve as image sensing cells, a plurality of columns of vertical CCD registers for reading out the signal charges from the photo diodes, and a horizontal CCD register for reading out the signal charges transferred by the vertical CCD registers. In this type of CCD image sensor, the larger the number of image sensing cells, i.e., picture elements, the higher the frequency of the drive signal for the horizontal CCD register. To prevent such an increase in the drive signal frequency, one of several known approaches is to array two horizontal CCD registers in parallel and to share the signal charges of the vertical CCD registers between these two registers. This system, which is known as a dual line IT-CCD, allows a low-frequency drive signal to be used for driving the horizontal CCD registers.

The manner in which the signal charges, as read out line by line by the vertical CCD registers, are shared between the first and second horizontal CCD register, will now be described.

An "H" clock is first applied to the output gate of the vertical CCD registers, to read out the signal charges of one line from the vertical CCD registers into the channel of the first horizontal CCD register. Then, an "H" clock is applied to the transfer gate between the first horizontal CCD register and the second horizontal CCD register, so that half of the signal charges in the first horizontal CCD register are transferred to the second horizontal CCD register. To effect the sharing of the signal charges between these two registers, a plurality of channel stoppers are formed under the transfer gate between the first and second CCD registers. In this way, the signal charges of the vertical CCD registers in the even-numbered column are transferred to the channel of the second horizontal CCD register, through the channel of the first horizontal CCD register. The signal charges are read out in parallel from the first and second horizontal CCD registers, and are phase-shifted by 180° and summed together, to form an electrical signal representing the picture elements of one line. Subsequently, the same operations are repeated to form a two-dimensional image signal.

The prior dual-line IT-CCD involves a drawback in that the vertical white-and-black pair line appear on the reproduced image. This problem arises due to the fact that the input conditions viz-a-viz the signal charges differ in relation to the first horizontal CCD register, which is located close to the image sensing area, and the second horizontal CCD register, which is located away from the image sensing area. When a large number of picture elements is arrayed, the transfer channels between the first and second horizontal CCD registers are narrowed, which are located between the channel stoppers. In such a case, the narrow channel effect occurs. This is referred to also by K. Orihara, et al., "NEW TECHNOLOGIES IN DUAL CHANNEL READ-OUT REGISTERS FOR HIGH DENSITY CCD IMAGE SENSOR", IEDM Tech. Dig., pp. 365 to 368, 1986. Insufficient distribution of the individual signal charges causes the phenomenon known as cross talk to occur. When the signal charges are insufficiently distributed, they then remain in the first horizontal CCD register, instead of being transferred across the channel thereof to the second horizontal CCD register.

SUMMARY OF THE INVENTION

Accordingly, an object of this invention is to provide a CCD image sensor which can reduce the vertical line noise appearing on the reproduced image due to the fact that the horizontal CCD registers have different input conditions.

In a CCD image sensor according to this invention, a plurality of horizontal CCD registers are so arrayed that the further a register is located away from the vertical CCD register, the higher is the impurity concentration of its buried channel. As a result, a special channel stopper does not have to be provided under the transfer gate between the horizontal CCD registers.

A collector layer is formed in the transfer channel region under the transfer gate between the horizontal CCD registers, and has the same impurity concentration as that of the channel of the horizontal CCD register located away from the vertical CCD register.

With such an arrangement, there is no need for a special channel stopper between the horizontal CCD registers, which implies that the narrow channel effect does not occur in the transfer channel between the horizontal CCD registers. Reliable distribution of the signal charge from the vertical CCD registers to the horizontal CCD registers is assured, under the clock control of the transfer gates on and between the horizontal CCD registers. The collector layer is formed in the channel region under the transfer gate between the horizontal CCD registers. The provision of this collector layer effectively reduces the residual charges, when the signal charges are transferred across the channel of the horizontal CCD register.

DETAILED DESCRIPTION OF THE PREFERRED EMBODIMENTS

An image sensing area is composed of a matrix array of photo diodes (image sensing cells) 1 and a plurality of vertical CCD registers 2 each arranged adjacent to the column of photo diodes of the aforementioned matrix. In the embodiments to follow, vertical CCD registers 2 are of a buried channel type and are driven by 4-phase clocks $\phi V1$ to $\phi V4$. First and second horizontal CCD registers 4A and 4B are arranged relative to the output terminals of respective vertical CCD registers 2. Output gate 3 is formed relative to the output terminals of vertical CCD registers 2. Output gate 3 is adapted to control the transfer of signal charges between the channels of vertical CCD registers 2 and that of first horizontal CCD register 4A. Transfer gate 5 is formed between first and second horizontal CCD registers 4A and 4B, to control the transfer of a signal charge between their respective channels. First and second horizontal CCD registers 4A and 4B are formed such that their transfer gates 6 and 7 are shared therebetween and driven by corresponding 2-phase clocks $\phi H1$ and $\phi H2$, respectively. In addition, these transfer gates 6 and 7 are arranged at the same pitch as that of vertical CCD registers 2 such that transfer gates 6 for storage are located each at a channel position of the vertical CCD register 2.

Figure 2:
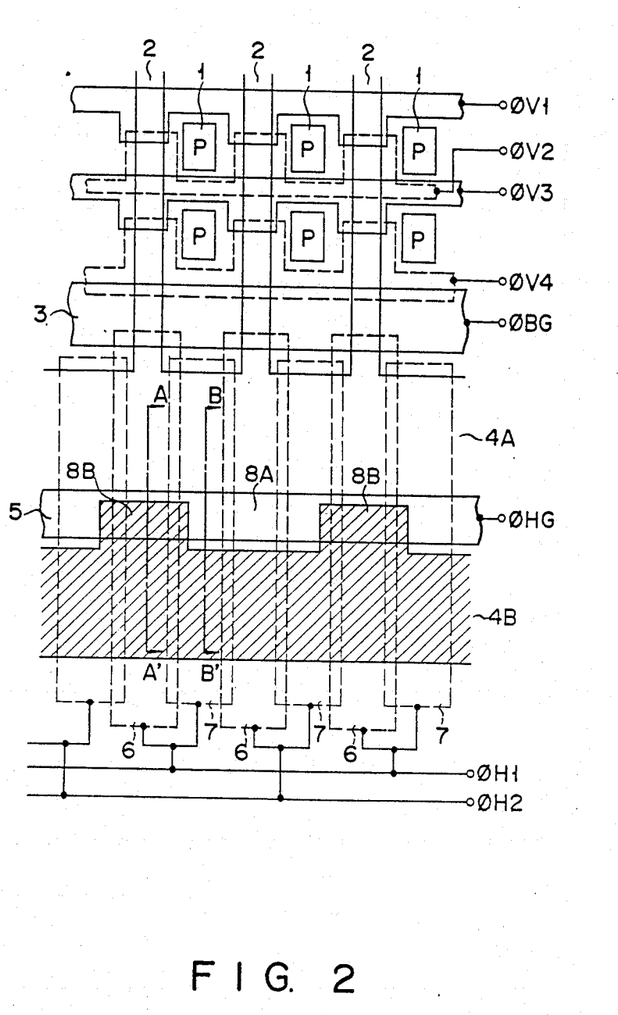
FIG. 2 shows a plan view of a major portion of the IT-CCD image sensor of FIG. 1.

First and second horizontal CCD registers 4A and 4B are both of a buried channel type. With regard to the portion of first and second horizontal CCD registers 4A and 4B which is located adjacent to the aforementioned image sensing area, first horizontal CCD register 4A has a channel impurity concentration set equal to that of vertical CCD register 2, with the channel impurity concentration of second horizontal CCD register 4B being set higher than that of register 4A. FIG. 2 is an enlarged view of an area situated adjacent to the image sensing area set forth above, in which the channel of first horizontal CCD register 4A has a different impurity concentration from that of second horizontal CCD register 4B, as indicated by the cross-hatched zone in FIG. 2. Stated in more detail, this embodiment is formed as follows.

An n type impurity is ion-implanted into element isolated regions of P type Si substrate 21, thereby to form n type layer 22, which provides a channel region for horizontal CCD registers 4A, 4B, and a buried channel within the entire area of transfer gate 5. An n type layer 23B is selectively formed, by use of an ion implantation method, in the channel region of second horizontal CCD register 4B. By so doing, a substrate surface potential difference is created between first and second horizontal CCD registers 4A and 4B. Transfer gate 5, located between the channels of horizontal CC registers 4A, 4B, is formed of a first polysilicon film, and transfer gates 6 and 7, which are situated in the channel regions, are formed of second and third polysilicon films, respectively.

In contrast with the prior art, a channel stopper is not formed below transfer gate 5 of the device of the present invention. Instead, as is shown in FIG. 2, those regions 8B which correspond to odd-numbered vertical CCD registers 2 are selectively set at the same impurity concentration as that of the channel region of second horizontal CCD register 4B. Region 8B provide a collector layer for efficiently effecting the transfer of a signal charge from first horizontal CCD register 4A to second horizontal CCD register 4B. Those regions 8A which correspond to even-numbered vertical CCD registers 2, on the other hand, are set at an impurity concentration equal to that of the channel region of first horizontal CCD register 4A. In order for collector layers 8B to be selectively formed under transfer gate 5, it is first of all necessary to form n type layer 23B, by use of a selective ion implantation method, prior to forming transfer gate 5.

Figure 3A:
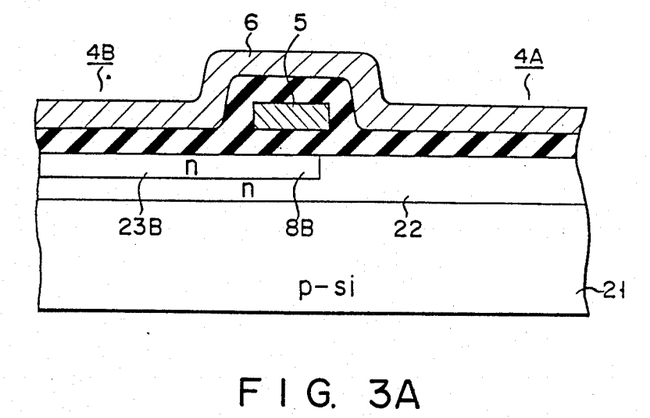
FIGS. 3A and 3B show cross sectional views taken on lines A—A' and B—B' in FIG. 2.
Figure 3B:
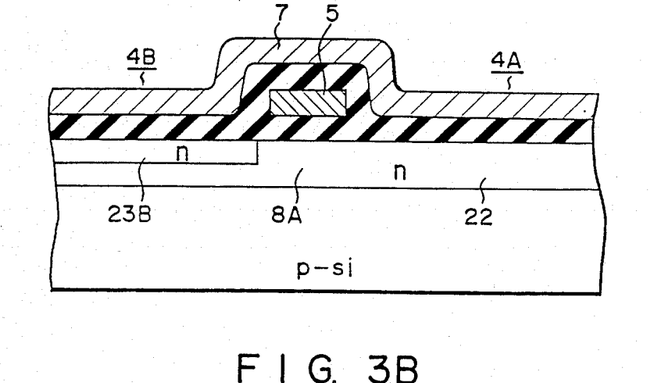
Figure 3C:
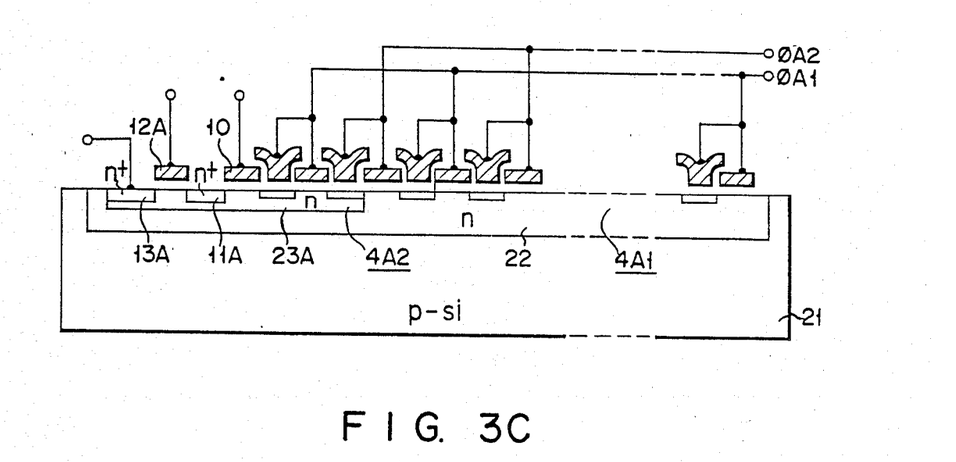
FIGS. 3C and 3D show cross sectional views taken on lines C—C' and D—D' in FIG. 1.
Figure 3D:
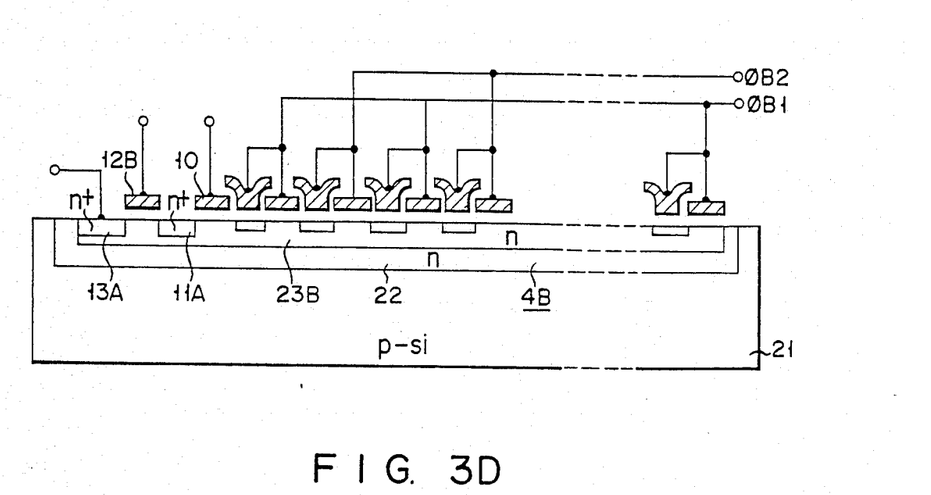

The formation of the channel impurity concentration difference over the whole area of first and second horizontal CCD registers 4A and 4B results in a difference in their channel output signal waveforms. This introduces a cause for synchronization noise. In this embodiment, the impurity concentration of both the channels set forth above are set equal to each other with attention focused on the neighborhood of the output terminals of first and second horizontal CCD regions 4A and 4B. Stated in more detail, as indicated by the cross-hatched lines in FIG. 1, the ion implantation stop is performed once in zone 4A1 of first horizontal CCD register 4A and twice in zone 4A2 in the neighborhood of the output section as in the channel of second CCD register 4B. FIGS. 3C and 3D are cross-sectional views showing a whole area of the channels set forth above. As evident from the cross-sectional view of FIG. 3, n type layer 23A is formed in first horizontal CCD register 4A at zone 4A2 near to the output terminal of the channel region, simultaneously with the formation of n type layer 23B of the channel of second horizontal CCD register 4B. In first horizontal CCD register 4A, zone 4A1 adjacent to the aforementioned image sensing area is different in channel impurity concentration from zone 4A2 near to the output terminal.

Figure 1:
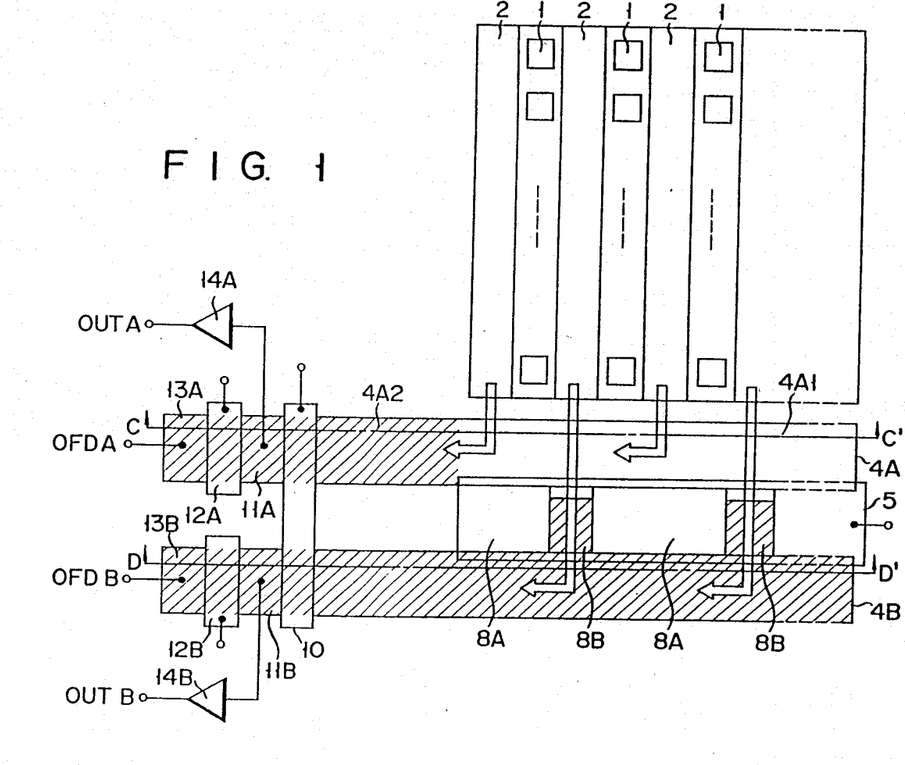
FIG. 1 shows a plan view of an embodiment of an IT-CCD image sensor according to this invention.

Output gate electrode 10 is provided in common at the output of each horizontal CCD registers 4A and 4B, as shown in FIG. 1 and FIGS. 3C and 3D. Also at the output of these registers, there are formed n+output terminal layers 11A and 11B of floating, reset gate electrodes 12A and 12B, and n+reset drain layers 13A and 13B. Output terminal layers 11A and 11B are connected through output amplifiers 14A and 14B to output terminals OUTA and OUTB.

The operation of the IT-CCD image sensor thus arranged will be described below. The signal charges stored in all of the photo diodes 1 are first transferred to vertical CCD registers 2 simultaneously during the vertical blanking period. The signal charges transferred to vertical CCD register 2 are directed to first and second horizontal CCD registers 4A and 4B for each horizontal line, as shown by arrows in FIG. 1, and read out at a high speed. The basic operation of this is substantially the same as that of the prior art.

In this instance, the signal charges in vertical CCD registers in odd- and even-numbered columns are directed to first and second horizontal CCD register 4A, respectively. At this time, the signal charges flows are under control by the output gate 3 of vertical CCD register 2, the transfer gate 5 between horizontal registers 4A and 4B, and the transfer electrodes 6 and for channel directional transfer of horizontal CCD registers 4a and 4B. Specifically, the signal charges of the vertical CCD registers of the odd-numbered column are transferred to the channel of first horizontal CCD register 4A, and stopped there. The signal charges in the vertical CCD registers of the even-numbered column are transferred through charge collector layer 8B to second horizontal CCD register 4B. It is noted here that the channel impurity concentration of second horizontal CCD register 4B is set to be higher than that of first horizontal CCD register 4A, and that charge collector layer 8B is provided. For these reasons, the signal charge transfer through first horizontal CCD register 4A to second horizontal CCD register 4B can be performed smoothly. The smooth transfer of signal charges will be discussed in detail.

Figure 5:
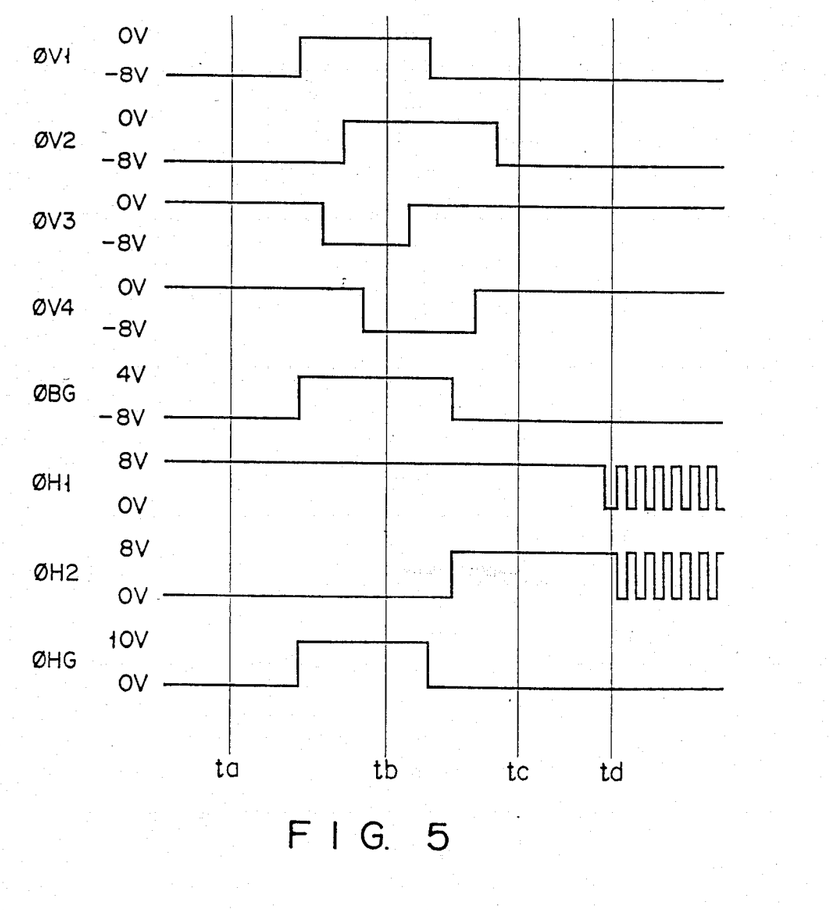
FIG. 5 shows a set of waveforms for explaining the operation whereby signal charges are distributed to be shared between; the two horizontal CCD registers.
Figure 6A:
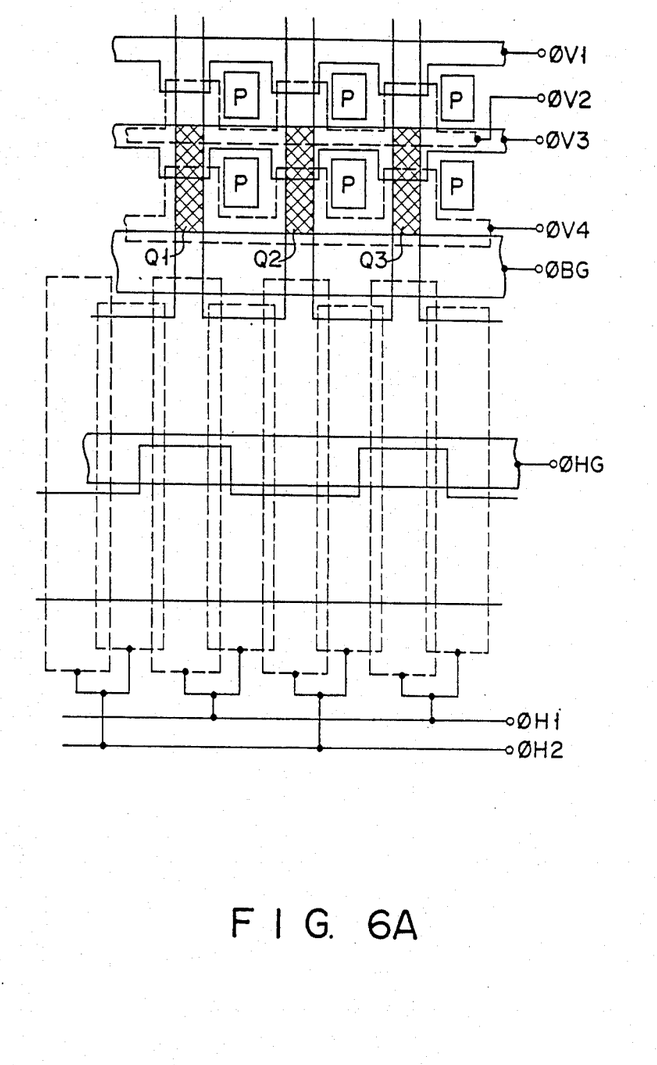
FIGS. 6A to 6D show partial plan views of the CCD image sensor, for explaining the manner in which the process of distributing the signal charges to share them between the two horizontal CCD registers is performed.
Figure 6B:
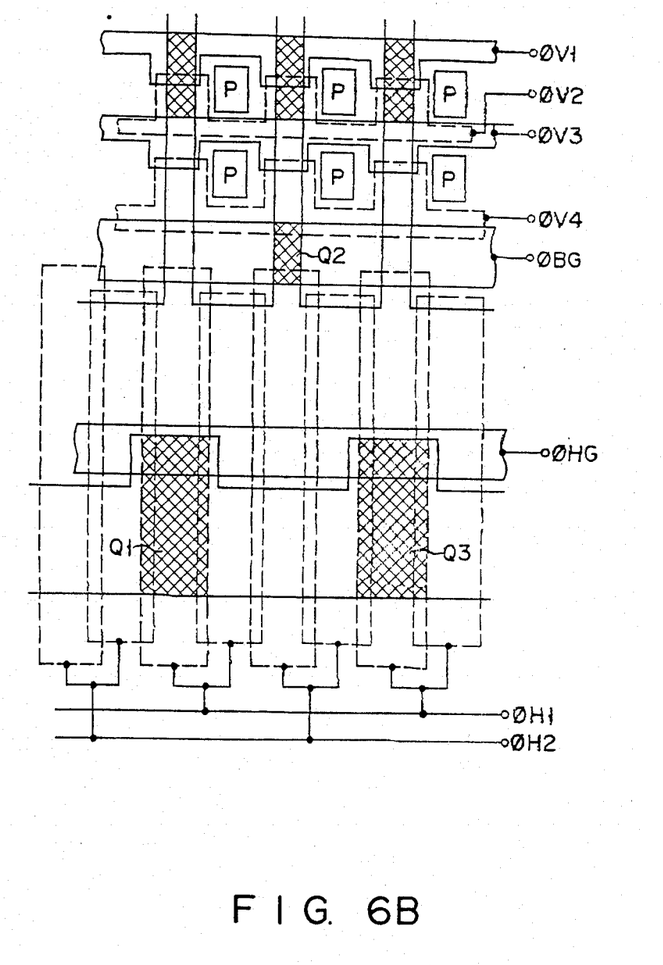
Figure 6C:
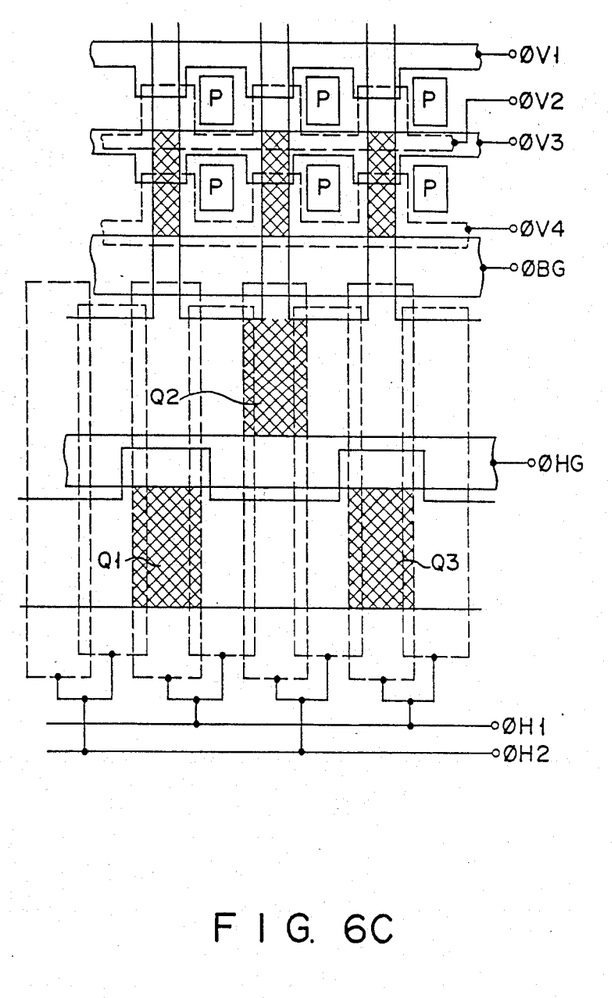
Figure 6D:
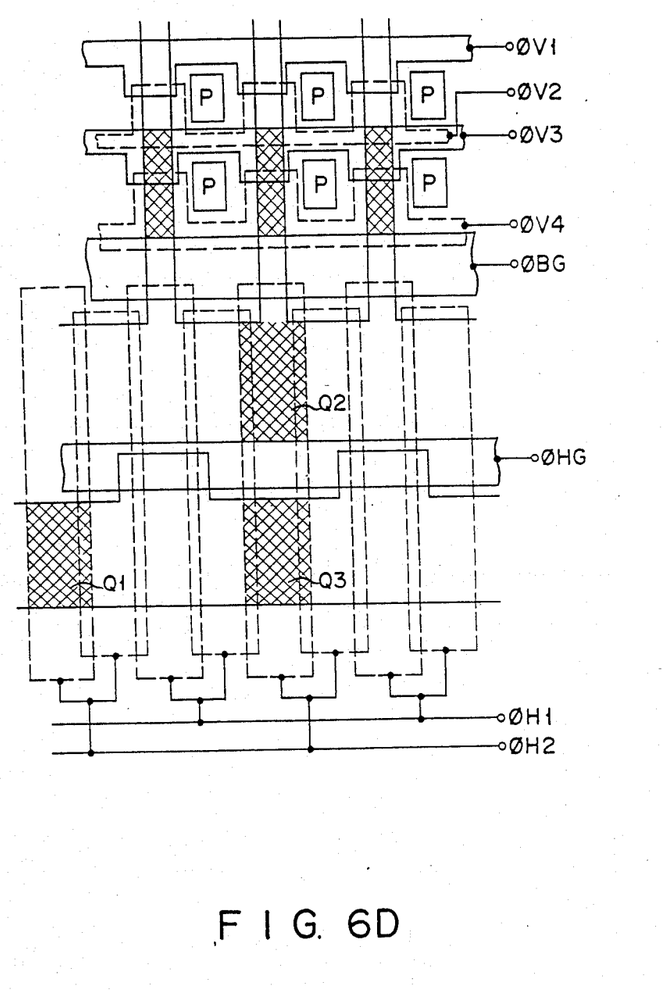

Clock waveforms shown in FIG. 5 graphically explain the transfer of signal charges from vertical CC register 2 to first and second horizontal CCD registers 4A and 4B, which is performed during the horizontal blanking period. A set of diagrams shown in FIGS. 6A to 6D illustrate how the signal charges are transferred during a specific period corresponding to time points ta to td in FIG. 5. As shown in FIG. 6A, signal charges Q1, Q2, Q3, ... are stored under the electrodes storing clock signals φV3 and φV4 of the vertical CCD register, as shown in FIG. 6A. Clock φBG at the output gate 3 of vertical CCD register 2 is "L" in level. At this time, first and second phase clocks φH1 and φH2 of the horizontal CCD register are "H" and "L" in level, respectively. Subsequently, the clock φBG to enable the output gate 3 of vertical CCD register 2 turns to "H" level and the clocks φV3 and φV4 of vertical CCD register 2 turn to "L" level. At time point tb, signal charges Q1, Q2, ... are transferred to under output gate 3. At this time, clock φH1 is in "H" level and φH2 in "L" level, to raise the channel potential of horizontal CCD registers 4A and 4B under odd-numbered vertical CCD register 2. In turn, signal charges Q1, Q3, ... are transferred to the channel of first horizontal CCD register 4A. At this time, the clock φHG at the transfer gate 5 between horizontal CCD registers 4A and 4B has been in "H" level, the signal charges Q1, Q3, ..., which have been transferred to the channel of first horizontal CCD register 4A ar intactly transferred to the channel of second horizontal CCD register 4B, after passing under transfer gate 5. As recalled, the channel potential of second horizontal CCD register 4B are higher than that of first horizontal CCD register 4A. Further, collector layer 8B at the same potential as that of the channel of second horizontal CCD register 4B is formed in the transfer channel portion under transfer gate 5. With these features, the signal charges are transferred completely and without any cross talk to second horizontal CCD register 4B, from the channel of first horizontal CCD register 4A The signal charges Q2 of the vertical CCD register 2 of the evennnumbered column stop in flow under output gate 3, because the channel potential of horizontal CCD register 4A under the vertical CCD register is low. This is illustrated in FIG. 6B. At time tc, clocks φBG and φHG is "L", and the output gate 3 and transfer gate 5 are off, and clock φH2 is "H". At this time point, signal charges Q2 are transferred to the channel of first horizontal CCD register 4A. The signal charges Q flow stops in the channel of first horizontal CCD register 4A, and the charges are never transferred to second horizontal CCD register 4B, because the potential under the transfer gate 5 between horizontal CCD registers 4A and 4B are lower than the channel potential. The reason for this follows. Under the vertical CCD register of the even-numbered column, the channel region of first horizontal CCD register 4A and the region 8A of transfer gate 5 are in the same potential when the same bias is applied to these regions. Since the clock φHG of transfer gate 5 is "L" and clock φH2 "H", however, a potential barrier parting the channels is formed in region 8A. In this way, the signal charges of vertical CCD register 2, those of the even- and odd-numbered columns, are distributed into first and second horizontal CCD registers 4A and 4B. The signal charges transfer phase is in turn shifted to the channel transfers in first and second CCD registers 4A and 4B. The transfer state of signal charges Q1, Q2, ... shown in FIG. 6D is obtained when clock φH1 first goes to "L" level, viz., at time td. Subsequently, the signal charges are transferred in parallel at high speed to the output terminals of horizontal CCD registers 4A and 4B, by the known 2-phase drive method. The parallel transferred signal charges are phase shifted by 180° and added together, to be an electrical signal of one line. The addition is applied to the signals when these are in the form of charges, and is output to exterior through a single output terminal. Alternatively, these signals may be output separately from the chip, and be added together in an external circuit.

As seen from the foregoing description, in this embodiment, the channel impurity concentrations of first and second horizontal CCD registers are different from each other. Any additional channel stopper is not provided under the transfer gate between first and second horizontal CCD registers. The collector layer is provided at the portion requiring the charge transfer between the first and second horizontal CCD registers. Therefore, the narrow channel effect never occurs under the transfer gate in the portion requiring the charge transfer to second horizontal CCD register, to provide a good charge transfer between channels. This indicates that high quality images can be reproduced free from vertical black-and-white pair lines. Further, since the transfer electrode is provided in common for the first and second horizontal CCD registers, the clock wiring to these transfer electrodes is easy. Although any special channel stopper is not provided between the horizontal CCD registers, the portion requiring the charge transfer between channels has the collector layer formed thereat, whose impurity concentration is approximately equal to the channel impurity concentration of the second horizontal CCD register. This feature completely solves the cross talk problem in which the signal charges leak to the adjacent transfer stage when the signal charges are transferred from the first horizontal CCD register to the second horizontal CCD register. This fact also contributes to the image quality improvement.

Figure 4:
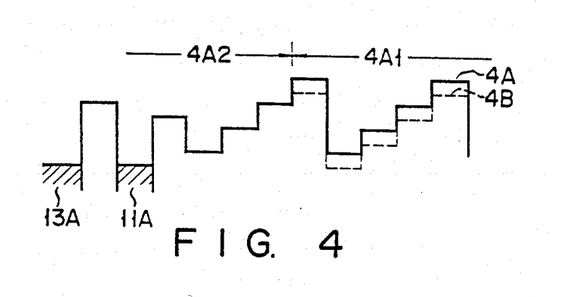
FIG. 4 shows a potential diagram illustrating how the signal charges are transferred in the vicinity of the output portion of two horizontal CCD registers.

As for the signal charge transfer by first and second horizontal CCD registers 4A and 4B, the portions adjacent to their image sensing areas have different channel impurities, but this little effects the output signal. This will be discussed in details referring to FIG. 4. In the figure, channel potential distributions of first and second horizontal CCD registers 4A and 4B are illustrated overlapping with each other. As described, in the regions adjacent to the image sensing area, i.e., the charge injected regions, the channel impurity concentrations of first and second horizontal CCD registers 4A and 4B are different from each other, and therefore the potentials of the transfer channels are different, as indicated by continuous and broken lines in FIG. 4. However, the channel impurity concentration is uniform between both the horizontal CCD registers 4A and 4B, in the range from the transfer stage near the output portion to output gate electrode 10, output terminal layers 11A and 11B, reset gate electrodes 12A and 12B, and reset drain layers 13A and 13B. Therefore, the signal charge transfer and outputting conditions are not different in these regions. As a result, the output signal waveforms of first and second horizontal CCD registers 4A and 4B do not differ, to prevent the periodic noise in the reproduced image.

While the dual line image sensing elements have been described in the above-mentioned embodiment, this invention is applicable for any other cases having three or more rows of the horizontal CCD registers. Particularly, in the case of three line type, a color stripe filter is provided on the photo diode column, the color signals R, G, and B are respectively distributed into three rows of horizontal CCD registers, and read out in a parallel fashion. This is a useful feature.

Figure 7:
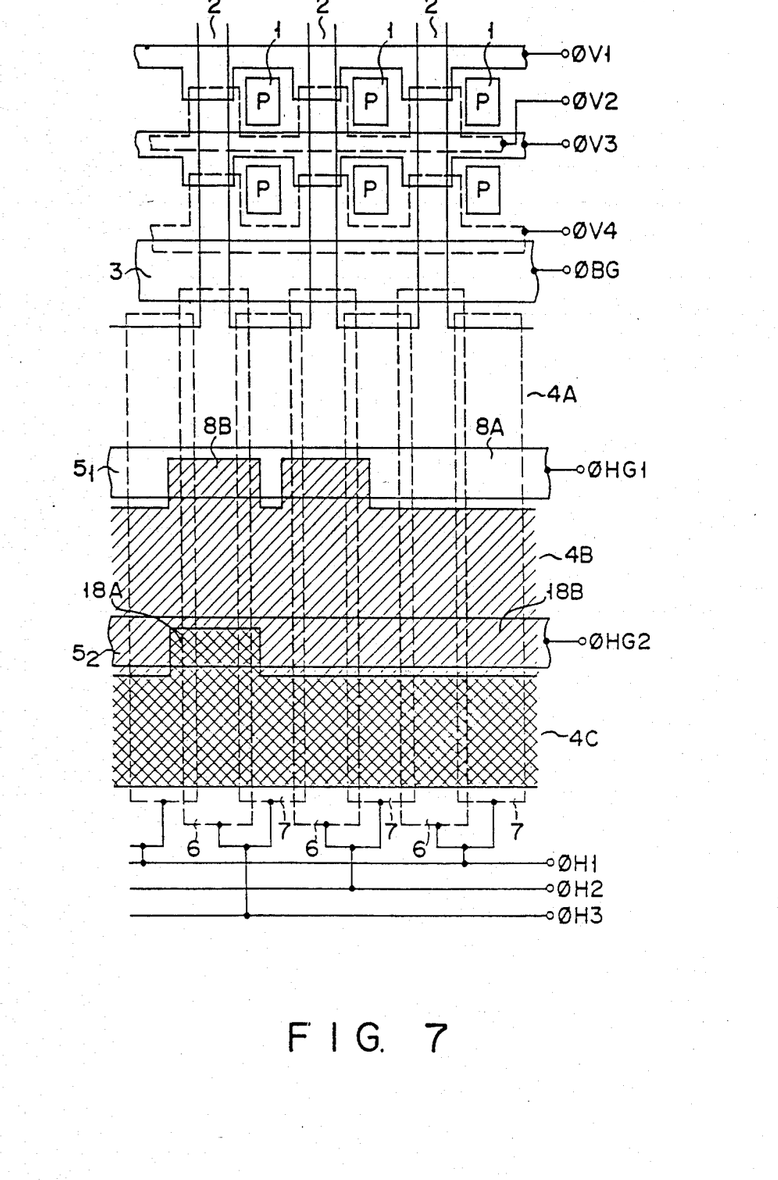
FIG. 7 shows a plan view of an IT-CCD image sensor according to another embodiment of this invention.

An embodiment of such a three line IT-CCD image sensor according to this invention will be described. A major portion of this embodiment is illustrated in FIG. 7 in connection with FIG. 2. In this embodiment, the channel impurity concentration of second horizontal CCD register 4B is set to be higher than that of first horizontal CCD register 4A. The channel impurity concentration of third horizontal CCD register 4B is set to be higher than that of second horizontal CCD register 4A. Under the transfer gate 5₁ between first and second horizontal CCD registers 4A and 4B, signal charge collector layer 8B to serve as the transfer channel is located at the place corresponding to the two vertical CCD register channels. Another region 8A has the same impurity concentration as that of the channel of first horizontal CCD register 4A. Under the transfer gate 5₂ between second and third horizontal CCD registers 4B and 4C signal charge collector layer 18A with the same impurity concentration as that of the channel of third horizontal register 4C is provided at the place corresponding to one vertical CCD register channel. Another region 18B has the same impurity concentration as that of the channel of the second horizontal CCD register 4B. The transfer gates 6 and 7 of these horizontal CCD registers 4A, 4B and 4C are driven by three-phase clocks $\phi 1$ to $\phi 3$. By this drive, the signal charge of three adjacent vertical CCD registers 2 can be distributed into three horizontal CCD registers 4A to 4C, respectively. To two-phase drive the signal charge transfer in horizontal CCD registers 4A to 4C, it is only needed to connect two clock lines together. Further, the region in the vicinity of the output portions of these registers 4A to 4C must have the same impurity concentration equal to the channel concentration of third horizontal CCD register 4C with the channel of the highest concentration.

Also in this embodiment, the signal charges can be completely transferred between the horizontal CCD registers, contributing to the improvement of reproduced images. While this invention has been described using the IT-CCD image sensor incorporating the invention, it is understood that this invention is applicable for the CCD image sensor of the frame transfer type.

What is claimed is:

1. A CCD image sensor having a plurality of horizontal CCD registers for reading out the signal charges which are stored in the image sensing area having matrix arrayed image sensing cells, the reading out of the signal charges being performed for every horizontal line, in which said plurality of horizontal CCD registers are so arranged that the further a register is located away from said image sensing area, the higher is the impurity concentration of its buried channel, and under the transfer gate between said horizontal CCD registers, a collector layer is selectively formed in the region where the signal charges are transferred to the horizontal CCD register located away from the image sensing area, after crossing the channel of the horizontal CCD registers located closer to said image sensing area, said collector layer having the same impurity concentration as that of the channel of the horizontal CCD register located away from said image sensing area.

2. The CCD image sensor according to claim 1, in which said image sensing area includes matrix-arrayed image sensing cells and a plurality of vertical CCD registers arrayed between the vertical linear arrays of said image sensing cells, for reading out the signal charges from said image sensing cells.

3. The CCD image sensor according to claim 1, in which the channel impurity concentration in the vicinity of the output stage of all of said horizontal CCD registers is set to be equal to the highest channel impurity concentration of said plurality of horizontal CCD registers.

4. The CCD image sensor according to claim 1, in which said plurality of horizontal CCD registers have transfer gates in common.

5. The CCD image sensor according to claim 1, in which said plurality of horizontal CCD registers comprises a first horizontal CCD register to which the signal charges in said image sensing area in odd numbered columns are directed, and a second horizontal CCD register to which the signal charges in said image sensing area in even-numbered columns are directed.

6. A CCD image sensor comprising:
an image sensing area having matrix-arrayed image sensing cells;
a plurality of vertical CCD registers arrayed between vertical linear arrays of said image sensing cells for reading out of signal charges from the sensing cells;
a plurality of horizontal CCD registers coupled to said vertical CCD registers for reading out signal charges transferred from the vertical CCD registers, for every horizontal line at the location of the image sensing area,
said plurality of horizontal CCD registers arranged so that the further a register is located away from said image sensing area, the higher is the impurity concentration of its buried channel;
a collector layer selectively formed under a transfer gate between said horizontal CCD registers, in the region where the signal charges are transferred to the horizontal CCD register located away from the image sensing area, after crossing the channel of the horizontal CCD registers located closer to said image sensing area, said collector layer having the same impurity concentration as that of the channel of the horizontal CCD register located away from said image sensing area; and
the channel impurity concentration in the vicinity of the output stage of all of said horizontal CCD registers being set to be equal to the highest channel impurity concentrations of said plurality of horizontal CCD registers.

7. The CCD image sensor according to claim 6, in which said plurality of horizontal CCD registers have transfer gates in common.

8. The CCD image sensor according to claim 6, in which said plurality of horizontal CCD registers comprises:
a first horizontal CCD register to which the signal charges in said vertical CCD registers in oddnumbered columns are directed, and
a second horizontal CCD register to which the signal charges in said vertical CCD registers in evennumbered columns are directed.

9. A CCD image sensor comprising:

an image sensing area having matrix-arrayed image sensing cells;

a plurality of horizontal CCD registers for reading out signal charges which are stored in said image sensing area, the reading out of the signal charges being performed for every horizontal line at the location of the image sensing area;

said plurality of horizontal CCD registers arranged so that the further a register is located away from said image sensing area, the higher is the impurity concentration of its buried channel; and a collector layer selectively formed under a transfer gate between said horizontal CCD registers, in a region where the signal charges are transferred to the horizontal CCD register located away from said image sensing area, after crossing the channel of the horizontal CCD registers located closer to said image sensing area, said collector layer being formed of an extension of the channel of the horizontal CCD register located away from said image sensing area.

10. The CCD image sensor according to claim 9, in which said image sensing area includes matrix-arrayed image sensing cells and a plurality of vertical CCD registers arrayed between the vertical linear arrays of said image sensing cells, for reading out the signal charges from said image sensing cells.

11. The CCD image sensor according to claim 9, in which the channel impurity concentration in the vicinity of the output stage of all of said horizontal CCD registers is set to be equal to the highest channel impurity concentration of said plurality of horizontal CCD registers.

12. The CCD image sensor according to claim 9, in which said plurality of horizontal CCD registers have transfer gates in common.

13. The CCD image sensor according to claim 9, in which said plurality of horizontal CCD registers comprises:

a first horizontal CCD register to which the signal charges in said image sensing area in oddnumbered columns are directed; and a second horizontal CCD register to which the signal charges in said image sensing area in evennumbered columns are directed.

14. A CCD image sensor comprising:

an sensing image sensing area having matrix-arrayed image cells;

a plurality of vertical CCD registers arrayed between vertical liner arrays of said image sensing cells for reading out of signal charges from the sensing cells; to a plurality of horizontal CCD registers coupled said plurality of vertical CCD registers for reading out signal charges from the vertical registers, for every horizontal line at the location of the image sensing area, said plurality of horizontal CCD registers arranged so that the further a register is located away from said image sensing area, the higher is the impurity concentration of its buried channel;

a collector layer selectively formed under a transfer gate between said horizontal CCD registers, in the region where the signal charges are transferred to the horizontal CCD register located away from the image sensing area, after crossing the channel of the horizontal CCD registers located closer to said image sensing area, wherein the channel of the horizontal CCD register located away from said image sensing area is extended to form said collector layer; and the channel impurity concentration in the vicinity of the output stage of all of said horizontal CCD registers being set to be equal to the highest channel impurity concentration of said plurality of horizontal CCD registers.

15. The CCD image sensor according to claim 9, in which said plurality of horizontal CCD registers have transfer gates in common.

16. The CCD image sensor according to claim 9, in which said plurality of horizontal CCD registers comprise:

a first horizontal CCD register to which the signal charges in said vertical CCD registers in odd-numbered columns are directed; and a second horizontal CCD register to which the signal charges in said vertical CCD registers in even-numbered columns are directed.

* * * * *